US010665624B2

(12) United States Patent
Ligozat et al.

(10) Patent No.: US 10,665,624 B2
(45) Date of Patent: May 26, 2020

(54) LINEAR SENSOR FOR A SPECTROSCOPIC OPTICAL COHERENCE TOMOGRAPHY IMAGING APPARATUS

(71) Applicant: Teledyne e2v Semiconductors SAS, Saint Egrève (FR)

(72) Inventors: Thierry Ligozat, Quaix en Chartreuse (FR); Bruno Gili, Grenoble (FR); Romain Guiguet, Grenoble (FR); Franck Tellier, Saint Martin D'Heres (FR); Norman Mangeret, St. Etienne de Crossey (FR)

(73) Assignee: TELEDYNE E2V SEMICONDUCTORS SAS, Saint Egreve (FR)

( * ) Notice: Subject to any disclaimer, the term of this patent is extended or adjusted under 35 U.S.C. 154(b) by 0 days.

(21) Appl. No.: 16/309,652

(22) PCT Filed: Jun. 20, 2017

(86) PCT No.: PCT/EP2017/065069
§ 371 (c)(1),
(2) Date: Dec. 13, 2018

(87) PCT Pub. No.: WO2018/001791
PCT Pub. Date: Jan. 4, 2018

(65) Prior Publication Data
US 2019/0165015 A1 May 30, 2019

(30) Foreign Application Priority Data

Jun. 30, 2016 (FR) ...................... 16 56158

(51) Int. Cl.
*H01L 27/14* (2006.01)
*H01L 27/146* (2006.01)

(52) U.S. Cl.
CPC .... *H01L 27/14607* (2013.01); *H01L 27/1463* (2013.01); *H01L 27/14623* (2013.01); *H01L 27/14625* (2013.01); *H01L 27/14629* (2013.01)

(58) Field of Classification Search
CPC ......... H01L 27/14607; H01L 27/14625; H01L 27/1463; H01L 27/14629; H01L 27/14623
See application file for complete search history.

(56) References Cited

U.S. PATENT DOCUMENTS 5,365,093 A 11/1994 Kuno
5,675,158 A 10/1997 Lee
(Continued)

FOREIGN PATENT DOCUMENTS

DE 4413824 A1 8/1995

OTHER PUBLICATIONS

International Search Report and Written Opinion for PCT/EP2017/065069, dated Aug. 3, 2017.

*Primary Examiner* — Tony Ko
(74) *Attorney, Agent, or Firm* — Piloff Passino & Cosenza LLP; Sean A. Passino; Rachel K. Pilloff

(57) ABSTRACT

The invention provides a linear sensor including a row 100 of N regularly spaced pixels that are formed in a semiconductor substrate, and a circuit for reading out the N pixels, which delivers an output signal for each of the N pixels of the row, characterized in that the N pixels comprise image-capturing pixels that have a useful photosensitive area in the shape of a rectangle R that is higher than it is wide, where the width is in the direction of the row and the height is in the perpendicular direction, and at least two spaced-apart pairs of alignment-detecting pixels $PP_L$, $PP_R$, wherein the detecting pixels of each pair are pixels $P_1$, $P_2$ that are adjacent in the row 100 of pixels and the useful photosensitive area $DT_1$, $DT_2$ of the detecting pixels has a width that (Continued)

varies monotonically in the height direction, but in opposite directions for the two detecting pixels of a given pair.

11 Claims, 6 Drawing Sheets

(56) References Cited

U.S. PATENT DOCUMENTS

| | | |
|---|---|---|
| 2002/0097331 A1 | 7/2002 | Yamada et al. |
| 2016/0045102 A1* | 2/2016 | Yu ........................ A61B 5/0035 600/427 |

* cited by examiner

LINEAR SENSOR FOR A SPECTROSCOPIC OPTICAL COHERENCE TOMOGRAPHY IMAGING APPARATUS

TECHNICAL FIELD

The invention relates to a camera used in optical-coherence-tomography imaging apparatuses comprising a spectrometer, said camera comprising a linear sensor.

DESCRIPTION OF THE PRIOR ART

Optical-coherence-tomography (OCT) imaging is a non-invasive and non-contact infrared imaging technique that allows a very high spatial resolution to be achieved with a good sensitivity, and that allows tissue depths of as much as about 10-12 millimeters to be reached. This imaging technique is thus widely used in conservative medical treatments and in diagnostics, and in particular in ophthalmology but also in dermatology to assist with the detection and inspection of architectural morphological modifications to tissues. In ophthalmology for example, OCT has become an indispensable tool for the diagnosis and monitoring of retinal pathologies, because it allows the various component layers of the retina to be viewed from front to back.

Optical coherence tomography (OCT) is based on low-coherence interferometry. It uses a low-coherence infrared source, and it is a question of measuring the travel time of light waves reflected or backscattered by reflective or backscattering structures of an object to be imaged, to determine their depths. The contrast of images obtained by the OCT technique results from nonuniformities in the refractive index within the object. It is thus possible to establish the reflectivity profile (1-D image) of an object in the longitudinal or axial direction (depth z) for fixed transverse x, y positions (points) of the object. By scanning various points (x, y) of the object, various profiles (interferograms) are obtained and it is possible to reconstruct 2-D images or even 3-D images.

The signal used to determine these depths may advantageously be detected directly in the frequency domain, i.e. derived from the frequency spectrum, spectrally resolved OCT or frequency-domain OCT (FD-OCT) techniques then being spoken of. Frequency-domain OCT imaging has undergone much development because it allows acquisition speed to be increased with respect to systems using detection in the time domain. It also has a better signal-to-noise ratio.

Depending on the type of light source used, there are various frequency-domain detecting techniques, but the technique to which the invention more particularly relates is one that is based on a low-coherence, broad-spectrum infrared source and that uses a spectrometer incorporating a line-scan camera, i.e. a camera comprising a linear sensor. For each point of the object to be imaged, the spectrometer, which is placed at the output of the interferometer, generates an image of interference fringes, this image being formed in the plane of the linear sensor of the line-scan camera: the sensor captures this spectral image and delivers as output a measurement of the intensity of the interference fringes.

The basic elements of an OCT apparatus of this type are schematically shown in FIG. 1.

The apparatus therefore comprises a Michelson interferometer 10, which is generally a fiber-optic Michelson interferometer. The interferometer is illuminated by a low-coherence, broad-band infrared light source SIR. The light received from the source is separated into two portions (beam splitter/optical coupler 11): one is sent to the reference arm 13 of the interferometer in order to illuminate the surface of a (fixed) reference mirror M; and the other is sent to the sample arm 12 of the interferometer in order to illuminate a point of the object O to be imaged. The light reflected or backscattered by the two arms 12 and 13 is delivered to the exit arm 14: interference occurs provided that the difference in the optical length of the two arms is smaller than the coherence length of the light.

A spectrometer 20 comprises a dispersive element 21, for example a diffraction grating associated with optical elements (lenses), that disperses the spectrum of the light received by the exit arm of the interferometer as a function of wavelength, and that selectively directs the various spectral regions toward various pixels of a photosensitive linear detecting array (linear sensor 31) of a camera 30. The camera incorporates the linear sensor 31 and the necessary optical elements.

The linear sensor 31 comprises a row of photosensitive pixels, for example 1024 pixels or 2048 pixels, and the circuitry for sequencing image capture and read-out of the pixels. It allows, for a point of the object to be imaged, a spectral image to be captured that is spread over the entire length of the row of pixels, and there is an established correspondence, for the spectrometer in question, between the positions of the pixels and the wavelengths of the spectral band of the source SIR. Each pixel allows the light intensity to be measured for a given wavelength of the spectrum. Thus, the output signals of the pixels allow the curve of light intensity as a function of wavelength to be directly established for each point of the object. These data are transmitted to a data-processing circuit (computer) in order to process them and display the tomographic images of the object.

Each time an image is captured by the line-scan camera, the signals output from the pixels are transmitted to a digital processing system 40 (computer) that knows the correspondence between the position of the pixel in the row of the linear sensor, and wavelength (calibration curve of the spectrometer), with a view to applying various algorithms, including a Fourier transform of the spectrum, and to delivering the 1-D depth profile at the observed point. By scanning the light beam over the object, the tomographic image is constructed by computation in 2 or 3 dimensions from the various obtained 1-D profiles.

PRESENTATION OF THE TECHNICAL PROBLEM

The image spectrally decomposed by the diffraction grating is projected into the photosensitive plane of the linear sensor, and forms, in this plane, a luminous line (a luminous strip) having a certain width (thickness of the strip), over the entire length of the sensor.

As it is desired to obtain the preciseest possible information for each wavelength of the spectral band of the light source of the OCT apparatus, the height of the pixels must at least correspond to the width of the luminous line, i.e. to the size of the luminous information to be captured; it is furthermore necessary for the projected luminous line to be correctly centered and aligned on the row of pixels: if this is not the case, some of the luminous line will be located outside the photosensitive frame of the row of pixels, and the corresponding information will be lost.

FIGS. 2a to 2c illustrate this problem of alignment of the luminous line 200 (shown in grey in the figure) projected onto the photosensitive row 100 of a linear sensor 31. The row 100 comprises n pixels P1 to Pn and extends horizontally in the plane of the paper.

To decrease the constraints on the precision of the alignment, the linear sensors used in OCT imaging generally use pixels the height of the photosensitive area of which is larger than the size of the luminous information to be captured, for example at least two times larger and up to 10 or 20 times larger: it is possible to consider all the photosensitive areas of the pixels of the row to be a frame inside of which the image line must be projected. The larger the height of the frame, the easier to is to frame the luminous line.

In FIGS. 2a to 2c, the pixels have been depicted by a single rectangle that is higher than it is wide, which represents the photosensitive area of the pixel, which is most of the pixel area. In other words, any elements for controlling or connecting the pixels placed between these photosensitive zones have been ignored. The center-to-center spacing of the pixels is the pitch p of the sensor, which corresponds substantially to the width (of the photosensitive area) of the pixels (ignoring any elements for controlling or connecting the pixels).

The spectral image to be detected, represented in FIG. 2a by the grey line 200, is, in this example, a luminous line taking the form of a rectilinear strip that extends over the entire length of the row of pixels, and this luminous line has a width e (in the direction of the height of the pixel) that is small with respect to the height h of the photosensitive rectangle area of the pixels. The ratio h/e may nonlimitingly be comprised between 2 and 20. In a numerical example given by way of nonlimiting example, the luminous line may have a width of 20 microns; and the pitch and height of the pixels may be 10 and 60 microns, respectively.

FIG. 2a shows the case of a correct alignment of the luminous line 200 on the photosensitive row 100 of pixels: the luminous line 200 is well centered with respect to the frame of the photosensitive area of the row 100 of pixels, both heightwise and widthwise. Each pixel may detect a maximum of luminous information. More precisely:

- the line is centered on the row 100 of pixels of the sensor in the direction of the height; i.e. the axis of horizontal symmetry of the image line is substantially coincident with the axis of horizontal symmetry of the row of pixels.
- the line is also centered on the row 100 of pixels of the sensor relatively to the length of the row of pixels.

In this case, if the spectral band of interest of the light source of the OCT apparatus is 845 nm +/−50 nm, the central pixel Pc will see all the information corresponding to the central wavelength $\lambda c$ of the spectral band to be detected, 840 nm for example; the first pixel $P_1$ at one end of the row of pixels will see all the luminous information corresponding to the minimum wavelength $\lambda min$ of the spectral band to be detected, 790 nm in the example ($\lambda c-50$ nm); and the last pixel $P_N$ at the other end of the row of pixels will see all the luminous information corresponding to the maximum wavelength $\lambda max$ of the spectral band to be detected, 890 nm in the example ($\lambda c+50$ nm).

FIGS. 2b and 2c show, by way of example, two possible misalignment situations. In the first case (FIG. 2b), the image line is parallel to the row of pixels but offset in x and in y; in the second case (FIG. 2c), the image line makes an angle to the axis of the row of pixels (FIG. 2d) and is also offset in y.

In practice, all these possible misalignment situations may be encountered: misalignment in x and/or y and/or angular misalignment. Furthermore, these misalignments are accompanied by some loss of information. In particular all the luminous information that is outside of the frame of the photosensitive zone of the pixels that allows light radiation to be detected is lost; and the light information seen by one pixel may correspond to a wavelength that is not the wavelength corresponding to the calibration.

Therefore, it will be clear that, in OCT imaging, the alignment of the luminous line on the row of pixels is a crucial operation, because the exploitation of the images for the purposes of diagnostics or medical monitoring depends on the quality and precision of the obtained tomographic images.

In practice, it is the integrator of the apparatus, i.e. the company that produces the apparatus, or the operator that performs on-site maintenance, who carries out this operation, i.e. who uses complex optical testing devices to finely adjust the position and orientation of the elements of the spectrometer of the OCT apparatus with respect to one another, i.e. of the dispersive element and/or the camera incorporating the linear sensor. Optical alignment marks (crosses) placed at each end of the row of pixels may be used for this operation.

This alignment problem arises both during integration of the apparatus and during its use, because the position and orientation adjustment of the elements of the spectrometer is sensitive to its conditions of use, whether it be a question of movements, which may create vibrations, or of changes in temperature.

SUMMARY OF THE INVENTION

The aim of the invention is to provide assistance with the alignment of an image line on a photosensitive row of a linear sensor, based on alignment information delivered by the sensor itself. The idea behind the invention is to obtain, from signals output by the sensor, precise information representative of the alignment of an image line with respect to the row of pixels of the sensor. It is then possible to correct/carry out the alignment on the basis of this information, using the conventional adjusting techniques employed with the spectrometer or OCT apparatus (position and orientation of the diffraction grating and/or of the linear sensor). The invention may be used at the moment the elements are integrated into the OCT apparatus and also throughout the lifetime of the apparatus.

More precisely, the invention uses the fact, verified in practice, that the difference between the wavelengths seen by two adjacent pixels is so small that they may be considered to deliver the same output response. In the example given above of a source SIR at 840 nm +/−50 nm, and of a row of 2048 pixels, the wavelength difference $\Delta\lambda$ between two adjacent pixels is smaller than 0.1 nm ($0.1 \cdot 10^{-9}$ m).

The idea of the invention is to modify the photosensitive portion of two adjacent pixels so that they deliver the same output signal in response when the image line is actually centered; and deliver a response that varies oppositely for the two pixels in case of misalignment: the sign of the difference between the two response signals makes it possible to directly determine whether the image line in the location of the pixels is off-centered toward the bottom or toward the top; the value of the difference more precisely makes it possible to determine by how much the image line is off-centered at this point.

If provision is made for such a pair of detecting pixels in two different locations of the row of pixels, the signals output by these pixels make it possible to precisely determine how the image line is positioned with respect to the row of pixels and to determine the corrections to be made to the position and orientation of the elements of the spectrometer.

Such as characterized, the invention relates to a linear sensor including a row of N pixels that are formed in a semiconductor substrate, and a circuit for reading out the N pixels, which delivers an output signal for each of the N pixels of the row, characterized in that the N pixels comprise image-capturing pixels that have a useful photosensitive area in the shape of a rectangle that is higher than it is wide, where the width is in the direction of the row and the height is in the perpendicular direction, and at least two spaced-apart pairs of alignment-detecting pixels, wherein the detecting pixels of each pair are pixels that are adjacent in the row of pixels and that have a useful photosensitive area the width of which varies monotonically in the height direction, but in opposite directions for the two detecting pixels of a given pair.

By "useful photosensitive area" of a pixel what is meant is the area of the pixel that may actually receive photons and convert them into electrical charge able to be accumulated with a view to measuring illuminance. Specifically, each pixel includes a photosensitive material that is able to accumulate photogenerated charge and that extends over a given area that may be referred to as the "photosensitive area". This photosensitive area is preferably rectangular. If this area actually receives light, it will produce and accumulate electric charge in proportion to the received light; if it is partially masked by an opaque mask, called an optical mask, only the unmasked area forms a "useful photosensitive area", i.e. an area that allows light radiation to be detected, since the masked area cannot generate electric charge.

In one embodiment, the physical makeup of all the N pixels is the same and an optical mask differentiates the image-capturing pixels from the alignment-detecting pixels. In this embodiment, all the pixels have a rectangular photosensitive area, and the optical mask defines a non-rectangular useful photosensitive area for the alignment-detecting pixels. The optical mask may also define, for the image-capturing pixels, a rectangular useful photosensitive area that is smaller (in practice less high) than the rectangular photosensitive area of the pixels.

In another embodiment, the shape of the photosensitive area portions of the detecting pixels is delineated by implantation. In this embodiment, there is no optical mask for delineating the useful area of the alignment-detecting pixels, and the "photosensitive area" and the "useful photosensitive area" of these pixels coincide.

The invention also relates to a camera for use in a spectrometer of a Fourier-domain optical-coherence-tomography imaging apparatus, which includes a linear sensor according to the invention, which delivers information on the alignment of a spectral image formed by the spectrometer in the plane of the photosensitive area of the sensor, on the row of image-capturing pixels of the sensor.

BRIEF DESCRIPTION OF THE DRAWINGS

Other features and advantages of the invention are presented in the following description, with reference to the appended drawings, in which.

DETAILED DESCRIPTION

The row of image-capturing pixels of a linear sensor according to the invention comprises, among the N pixels of the row, at least two pairs of adjacent pixels the output signals of which are used for an alignment detection. The detecting pixels are such that the useful photosensitive area of the pixel, i.e. the portion of the photosensitive area of the pixel that allows light radiation to be detected, has a width that varies monotonically in the height direction, but in opposite directions in the two pixels of a given pair.

The two pixels of each pair thus have, by construction, a response asymmetry over the height of the pixel. This response asymmetry allows the height of the image line level with the pair of pixels to be determined with precision. The image-capturing pixels have, in contrast, a useful photosensitive area the width of which is constant.

It is generally possible to liken the image line projected by the spectrometer into the plane of the photosensitive area of the linear sensor to a rectilinear luminous strip: two pairs of detecting pixels according to the invention, preferably one pair at each end of the row, deliver two pieces of information at two "points of interest" of the row of pixels, allowing the position of the image-line strip to be precisely determined. A point of interest corresponds to a pair of detecting pixels; and the detection makes it possible to say whether, at the point of interest, the image line passes through the center, above the center or below the center.

In certain spectrometers, the projected image line rather has the shape of a half-sinusoid with a maximum peak or trough amplitude substantially in the middle of the row of pixels. In this case, provision is preferably made for at least one third pair of detecting pixels, defining a third point of interest in the row of pixels in the vicinity of the middle of the row of pixels. The combination of the information delivered by the detecting pairs provided at the ends and in the vicinity of the middle makes it possible to verify that the image line does not leave the frame of the row of pixels: the axis passing through the centers of the pixels of the row must correspond to a perpendicular bisector of the shape of the image line.

In practice, to carry out the alignment detection, the light flux emitted directly by the light source of the OCT apparatus will possibly be used as input of the spectrometer (or a mirror placed in the place of the object to be imaged) so that the image projected by the spectrometer into the plane of the photosensitive area of the sensor contains nonzero luminous information over the entirety of the spectral band of the source. In particular, in this way the luminous power information is set and nonzero at the wavelength of each of the detecting pixels of the alignment-detecting pairs provided in the image-capturing row.

Figure 1:
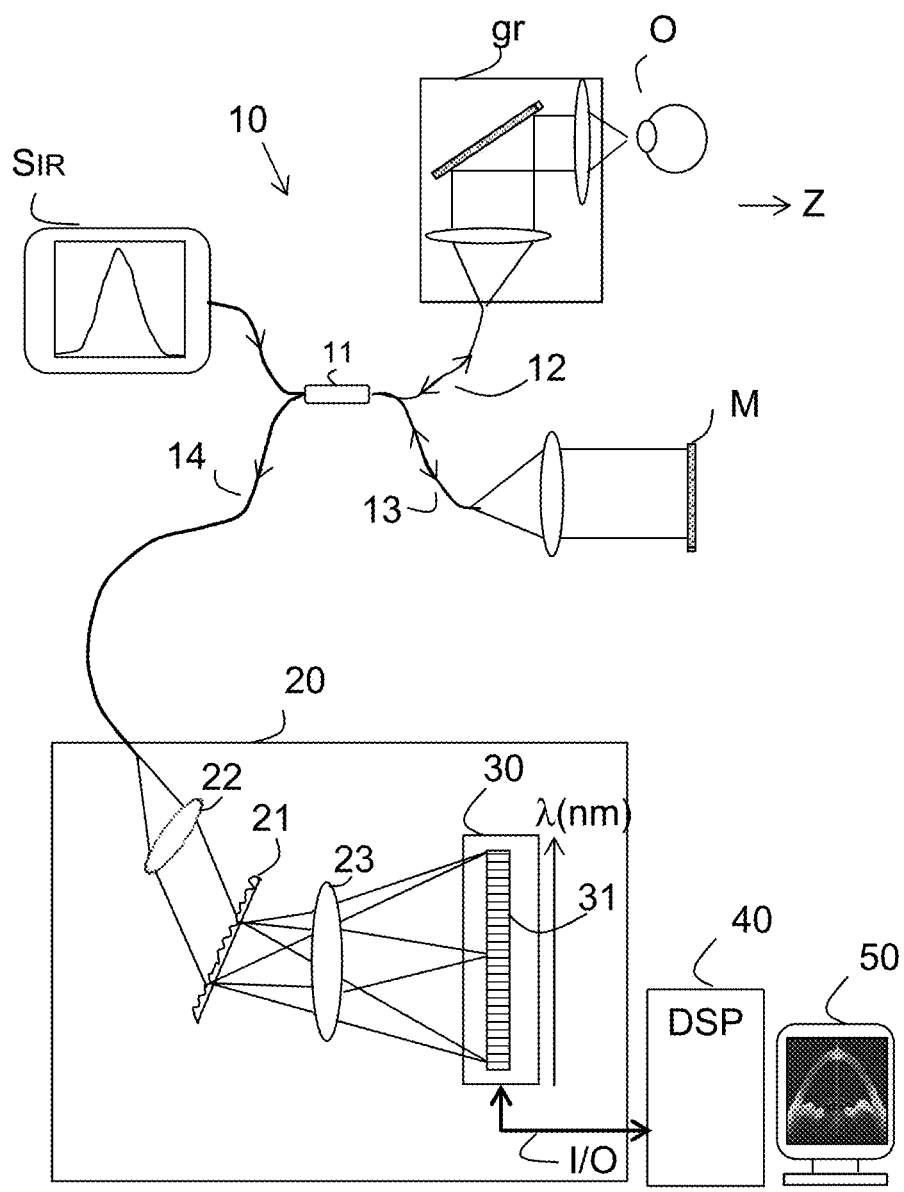
FIG. 1, which has already been described, illustrates the makeup of a Fourier-domain OCT apparatus comprising a spectrometer.
Figure 2A:
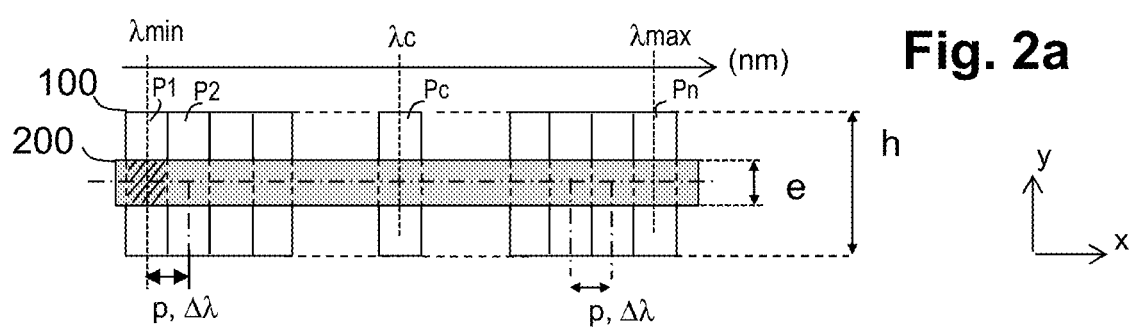
FIGS. 2a, 2b and 2c illustrate the problem of alignment of the luminous-image source with respect to the linear sensor of the camera of the spectrometer of the OCT apparatus.
Figure 2B:
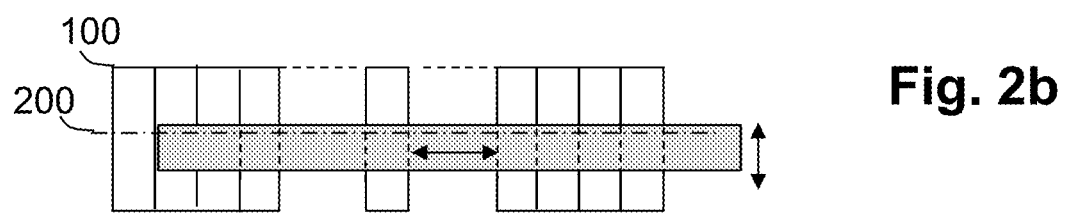
Figure 2C:

The detecting pixels are read out just like all the other pixels of the row, by the circuit for reading out the pixels (CAN, FIG. 3), which transmits the obtained output signals to the image-processing computer (FIG. 1). The latter may easily process the signals delivered by the detecting pixels of each pair, i.e. compute the difference between the two signals of each pair, to precisely determine the position of the image line, and any corrections that need to be made thereto.

Figure 3:
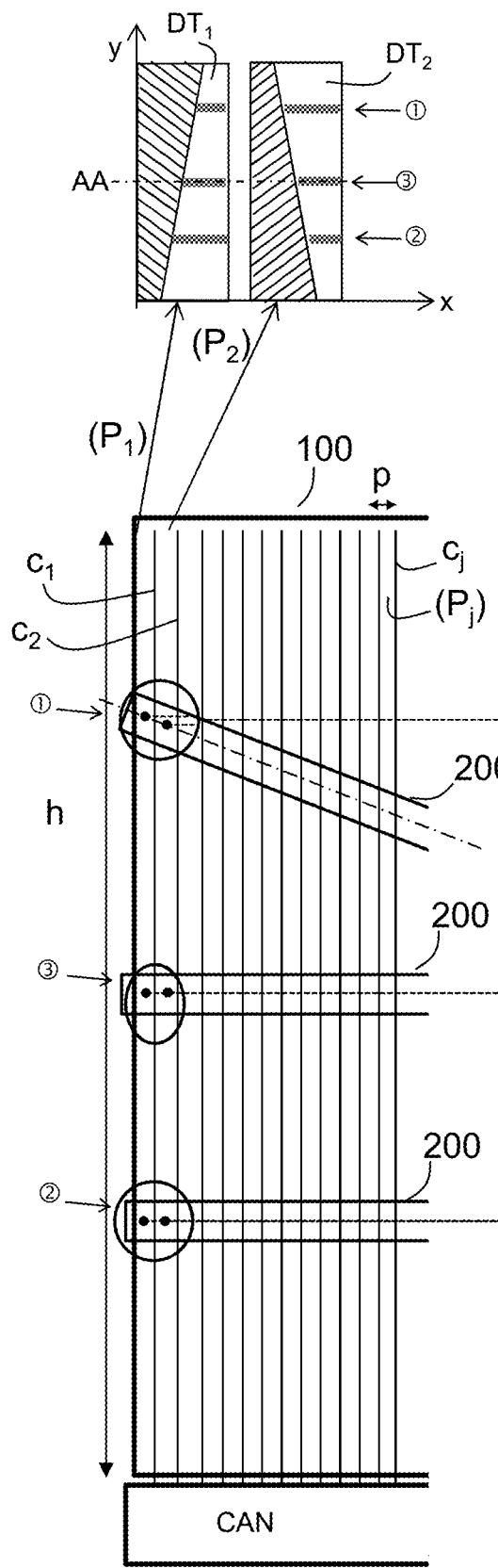
FIG. 3 illustrates the principle of an alignment detection based on a pair of detecting pixels according to the invention.
Figure 3:
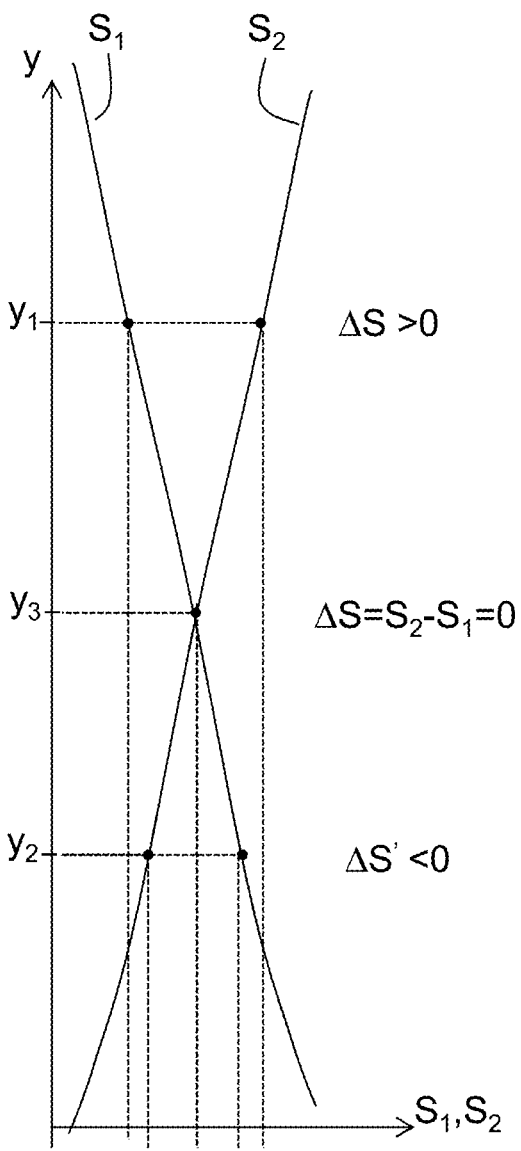

FIG. 3 illustrates the principle of the invention with a top view of the first pixels $P_1$, $P_2$, ... $P_j$ of a photosensitive row 100 of the linear sensor; an enlarged view of one possible construction of the two first pixels $P_1$ and $P_2$, which form a pair of detecting pixels according to the invention; and the response curve of these two pixels depending on the height of the information captured thereby.

The linear sensor is of conventional makeup and produced in a CCD or CMOS technology well known to those skilled in the art.

The pixels, which are of identical structure, have a wire-like aspect, i.e. they have essentially the shape (to within manufacturing tolerances) of a rectangle that is higher than it is wide in a ratio that may be as high as 10 or 20 for example. The shape that is being spoken of here is the shape (of the photosensitive element of the pixel) as seen in the surface plane of the semiconductor substrate in which the sensor is produced.

It has already been explained that the pixel structure may comprise, in addition to the photosensitive element, other connecting or controlling elements, and that there may therefore be elements for controlling or connecting a pixel placed between the photosensitive element of the pixel and the photosensitive element of the following pixel in the row. In the example of FIG. 3, for each pixel $P_1$, $P_2$, ... $P_j$ of the row, a corresponding conductive element $c_1$, $c_2$, has been shown; these conductive elements are arranged in columns and each thereof serves to convey the charge accumulated in the photosensitive element of the pixel to which it is connected to a respective stage of a read-out circuit CAN (analogue-digital conversion) that is placed at the foot of the columns. It is the circuit for reading out the sensor that delivers the (digital) output signals of the pixels. In the context of a linear sensor integrated into the spectrometer of an OCT imaging apparatus, it has been explained that two adjacent pixels, the centers of which are separated by the pitch p of the row of pixels, see the same luminous information, i.e. they are not sensitive to the wavelength difference $\Delta\lambda$ between the two pixels (to the first order). By ensuring, by design, an asymmetric response relative to the height of two adjacent pixels, it is possible to determine whether the luminous information seen by the two pixels, the size of which information is small with respect to the height of the photosensitive portion of the pixel, is centered in the location of the two pixels, or off-centered toward the top or toward the bottom. If in practice the two neighboring pixels do not see exactly the same luminous information, it will be possible to determine the small difference in response of the two pixels when the sensor is calibrated, in order to allow this difference to be taken into account when the signal is analyzed during the alignment.

In the example illustrated in FIG. 3, the two pixels $P_1$ and $P_2$ of the row 100 of pixels form an alignment-detecting pair according to the invention: the portions allowing light information to be detected in these pixels are the portions referenced $DT_1$ for the pixel $P_1$ and $DT_2$ for the pixel $P_2$, respectively. The portion $DT_1$ of the pixel $P_1$ is wider at the bottom (ordinate of 0) than at the top (ordinate of H) and the response curve $S_1$ decreases monotonically with height. For the pixel $P_2$ the inverse is true.

Situation ① illustrated in FIG. 3 shows the case of an image line that, level with the pixels $P_1$ and $P_2$, is off-centered toward the top of the row of pixels: the pixel $P_1$ will respond less than the pixel $P_2$ and the output signal $S_1$ will be small with respect to the output signal $S_2$. The image line also has an inclination, which has been exaggerated in the figure. In fact, on account of the ratio between the height h of the detecting window and the row length (generally more than 1000 or 2000 pixels) two adjacent pixels perceive the information at substantially the same height, which height is indicated on the curve by the ordinate $y_1$.

Situation ② is the inverse situation: the image line is off-centered toward the bottom, at a height indicated on the curve by the ordinate $y_2$: the pixel $P_1$ will respond more than the pixel $P_2$ and the output signal $S_1$ will be large with respect to the output signal $S_2$.

Situation ③ is that of a centered image line: the pixels $P_1$ and $P_2$ return the same response, corresponding to an image-line height indicated by the ordinate $y_3$, which corresponds to the height of the central axis of the row of pixels (passing through the centers of the pixels).

The sign of the difference $\Delta S = S_2 - S_1$ between the two output signals of the pixels $P_1$ and $P_2$ allows the position of the image line in this location, with respect to the center of the pixels $P_1$ and $P_2$, to be directly determined.

If the response curve of the pixels is known, for a given luminous power (calibration curve), it is also possible to determine, from the signal difference $\Delta S = S_2 - S_1$, the height of the image at the point of interest.

The output signals of the detecting pixels $P_1$ and $P_2$ therefore allow information on the position of the image line at a point of interest of the row of pixels of the sensor to be obtained.

The two pixels $P_1$ and $P_2$ are here considered to deliver the same output-signal value ($S_1 = S_2$) in response to the same luminous information (wavelength, power). In practice, the responses of the two pixels may not be strictly equal; however, these responses will be deterministic for a given OCT apparatus and a given source SIR, i.e. it is possible to calibrate a sensor designed according to the invention depending on the characteristics of the light source of the OCT apparatus and on the characteristics of the spectral dispersion of the spectrometer. In other words, for a given OCT apparatus, it will be possible to generate calibration curves for the output signals of each of the detecting pairs.

Figure 4:
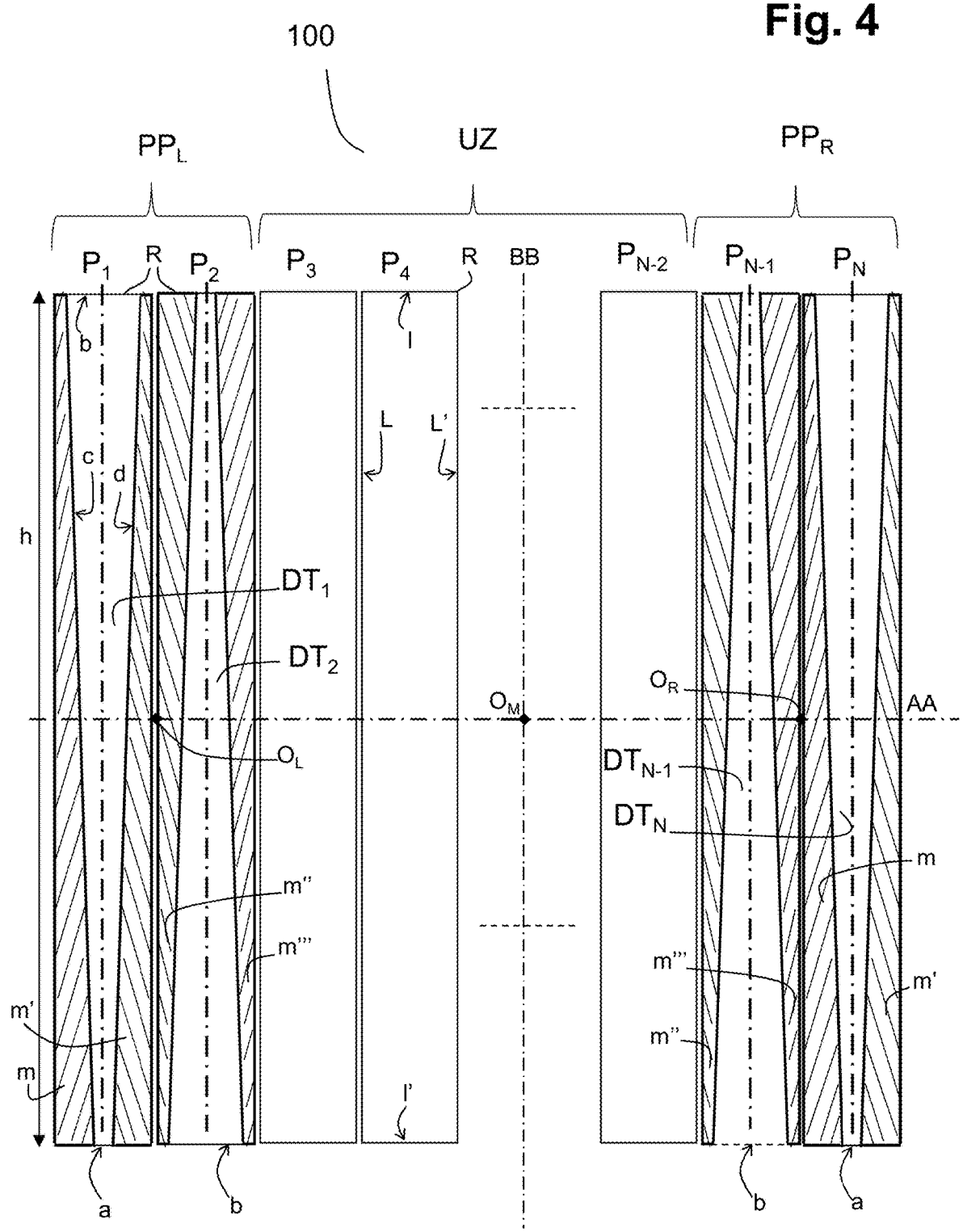
FIG. 4 illustrates a photosensitive row of a linear sensor comprising two pairs of detecting pixels, one at each end of the row, and a first embodiment of the detecting pixels.
Figure 5:
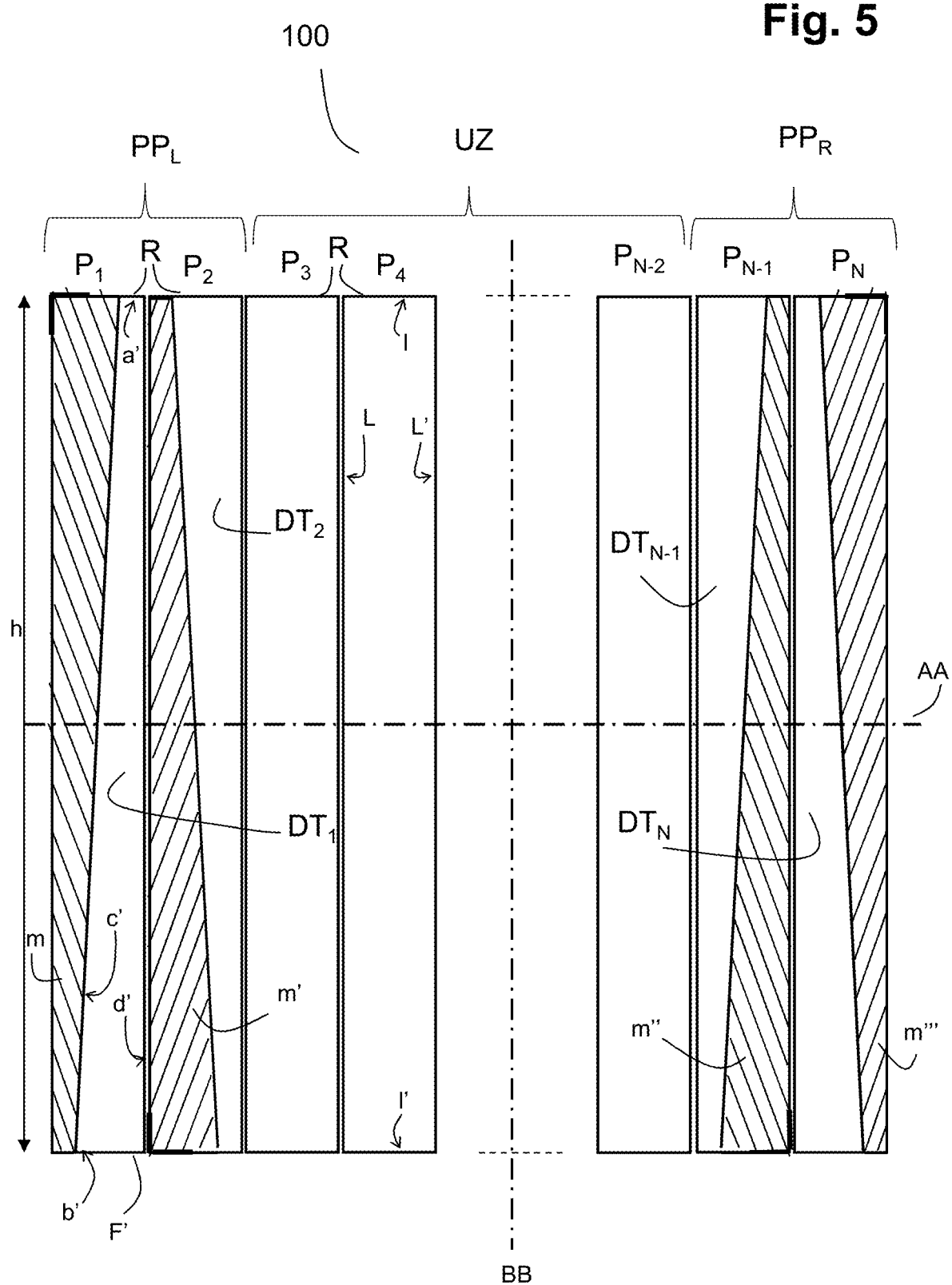
FIG. 5 illustrates a second embodiment of the detecting pixels of the row of FIG. 4.

FIGS. 4 and 5 show one example embodiment of a row 100 of N pixels $P_1$ to $P_N$ including two pairs of detecting pixels according to the invention, which deliver two pieces of position information, at two different points of interest of the row of pixels. Preferably, and as shown in the figures, the two pairs are each at one end of the row: the pair $PP_L$ is formed by the first two adjacent pixels of the row, $P_1$ and $P_2$; the pair $PP_R$ is formed by the last two adjacent pixels of the row, $P_{N-1}$ and $P_N$. In these figures, the axis AA is the central axis of the row of pixels, which passes through all the centers of the pixels of the row. As was possibly explained above, if an image line that is the shape of a substantially rectilinear strip is considered, each pair returns information on the position of the image line; and the two pairs therefore make it possible to determine the position of the image line at two points of interest of the row of pixels with respect to the axis AA: namely, whether the image line is centered on the row of pixels; or whether it is on the axis of the row of pixels but offset toward the top or toward the bottom; or even whether it is inclined with respect to the axis of the row of pixels, and in which direction.

In these two figures, all the pixels of the row are identical as regards their semiconductor structure. In particular, the photosensitive elements (generally photodiodes) of all these pixels have photosensitive areas, in the surface plane of the semiconductor substrate, that are all the same shape, i.e. a rectangle R that is higher (height h) than it is wide.

An optical-mask level produced above the plane of the photosensitive area then makes it possible to define (delineate) the useful photosensitive area ($DT_1$, $DT_2$, $DT_{N-1}$ and $DT_N$) of the detecting pixels ($P_1$, $P_2$, $P_{N-1}$ and $P_N$) that allows light radiation to be detected according to the invention. Preferably, and as illustrated, the pattern of the useful photosensitive area of the detecting pixels is identical for all the detecting pixels, but it may be oriented in opposite directions for the two pixels of a given pair.

In the example of FIG. 4, the useful photosensitive area of the detecting pixels has a shape F (comprised in the rectangle R) that is identical for all the detecting pixels, that extends over the entire height of the rectangle between the short sides I and I' of the rectangle R, and that has an axial symmetry with respect to the perpendicular bisector of these short sides of the rectangle (symmetry with respect to a line extending along the height of the pixels). The shape F is thus bounded heightwise by two sides a and b, the side a being shorter than the side b; and it is bounded widthwise by two inclined lateral sides c and d on either side of the perpendicular bisector of the top edge I and bottom edge I' of the rectangle. In each pair, the orientation of the shape F of the detecting portion is inverted between the two detecting pixels: for one, the shortest side a of the pattern is at the bottom, and for the other this shortest side a is at the top. The masked portions of the photosensitive area of the detecting pixels are shown hatched in FIG. 4. These are the two portions referenced m and m' for the pixel $P_1$ and m" and m'" for the pixel $P_2$.

Preferably, and as illustrated, the complete pattern of a detecting pair, including the two masked portions and the useful photosensitive portion of the two pixels of the pair, has rotational symmetry with respect to the midpoint between the two centers of the pixels of each pair. This midpoint is the point referenced $O_L$ for the pair $PP_L$ and $O_R$ for the pair referenced $PP_R$.

In the example, the complete pattern of the pixel $P_{N-1}$ of the pair $PP_L$ corresponds to the complete pattern of the pixel $P_2$ of the pair $PP_G$; and the complete pattern of the pixel $P_N$ corresponds to the complete pattern of the pixel $P_1$. It could equally well be chosen to make the pixel $P_1$ correspond (in terms of shape) to the pixel $P_{N-1}$ and to make the pixel $P_2$ correspond (in terms of shape) to the pixel $P_N$.

These aspects of conservation of shape and symmetry facilitate the design, production and use of the output signals of the detecting pixels according to the invention. However, the outlines could be different without this changing the principle and effects of the invention. All that is required is to be able to detect a light flux of small size over the entire height of pairs of detecting pixels, with, in each pair, a response asymmetry obtained by making the width of the useful photosensitive area, i.e. of the area allowing the light flux to be detected, vary monotonically over this height, but in opposite directions for the two detecting pixels of the same pair.

Figure 8:
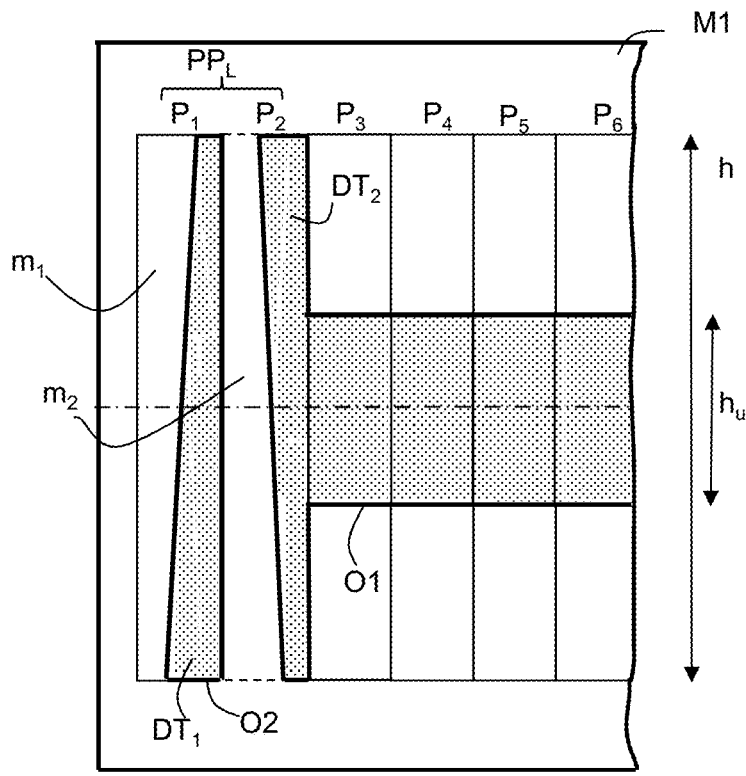
FIG. 8 illustrates one embodiment of a photosensitive row such as illustrated in FIG. 5, 6 or 7, using an optical mask to delineate the photosensitive portions of the detecting pixels.

In the illustrated example, the entire height h of the rectangular photosensitive area of the image-capturing pixels serves for the detection of light radiation. However, in practice, the useful detecting height of the image-capturing pixels may be smaller, depending on the specifications of the OCT apparatus. This adjustment is made by optically masking, symmetrically, a top band and a bottom band of the rectangle R, as illustrated in FIG. 8.

It is advantageously possible to use the same mask level not only to decrease the size of the photosensitive detecting window of the image-capturing pixels but also to delineate the useful photosensitive area of the detecting pixels. In the example in FIG. 8, the apertures O1, O2 produced in the mask (an opaque metal (aluminum) level above the active surface level of the semiconductor substrate) delineate the various useful photosensitive areas (dotted fill) that allow light to be detected by the detecting pixels and the image-capturing pixels. These zones that are opened optically by the apertures O1 and O2 in the mask are dotted in the figure. In the example, the outline of the apertures O1 and O2 is such that the useful photosensitive areas $DT_1$ $DT_2$ of the detecting pixels extend along the whole height h of the rectangle R, in order to preserve a detecting window of large heightwise extent. However, it may be preferred to increase the uniformity of the useful photosensitive-detecting height of all the alignment-detecting and image-capturing pixels; this may facilitate the interpolation computations carried out on the signals delivered by the alignment-detecting pixels with a view to allowing these signals to be used, with those delivered by the image-capturing pixels, for image reconstruction.

The embodiment shown in FIG. 4 has one drawback: the presence of the optical mask on each edge of the rectangular initial photosensitive area may disrupt the generation and accumulation of charge in the image-capturing pixel adjacent to a detecting pixel. In the example, the image-capturing pixels in question are the pixels P3 and $P_{N-2}$ and the response of these pixels may be degraded (problem of crosstalk). Since this effect is not present in the other image-capturing pixels, the response of all of the image-capturing pixels is no longer uniform, this possibly degrading the quality of the obtained images.

It will be noted in this respect that the decision to place the two detecting pairs each at one end of the row of pixels has the advantage of limiting these edge effects due to masking to a single image-capturing pixel.

FIG. 5 shows another example embodiment, which has the advantage of limiting, in the image-capturing pixels, edge effects due to the delineation by optical mask of the alignment-detecting pixels.

In this embodiment, the rectangle R of a detecting pixel is then divided into two portions: a useful photosensitive portion that enables the detection, and a masked portion in which detection is prevented. At least in the detecting pixels that are adjacent, on one side, to an image-capturing pixel, the useful detecting portion is placed on the side adjacent to the image-capturing pixel.

In the example, the respective shapes of the masked portion and the photosensitive detecting portion are identical in all the detecting pixels. What changes is their orientation. In particular, the detecting portions of all the alignment-detecting pixels have an identical shape F', which is comprised in the rectangle R. This shape F' extends over the height h of the rectangle between the short sides I and I' of the rectangle R; and one lateral side of this shape F' corresponds to one long side of the rectangle. The shape F' is thus bounded heightwise by two sides a' and b', the side a' being shorter than the side b'; it is bounded widthwise by an inclined lateral side c' and a right lateral side d' that corresponds to one long side of the rectangle R. In each pair, the orientation of the shape F' of the detecting portion is inverted between the two detecting pixels: for one, the shortest side a' of the pattern is at the bottom, for the other this shortest side a' is at the top.

In the illustrated embodiment, the detecting portions are placed on the same side of the rectangle for the detecting pixels of a given pair: to the right for the pixels of the left-most pair $PP_L$; to the left for the pixels of the right-most pair $PP_R$. Furthermore, the complete pattern including the masked portions and the detecting portions of the pixels of the two pairs $PP_L$ and $PP_R$ has an axial symmetry with respect to the axis BB. This could be otherwise; for example, the pixel $P_{N-1}$ could have the complete pattern of the pixel $P_N$ (and the pixel $P_N$ the complete pattern of the pixel $P_{N-1}$), without affecting the alignment-detection principle according to the invention.

In this configuration, within each pair, one detecting pixel ($P_2$ or $P_{N-1}$) is subject to edge effects due to the masked portion of the pixel itself; for the other detecting pixel ($P_1$ or $P_N$), these effects are due to the masked portion of the pixel itself and to the masked portion of the other detecting pixel of the pair. It is therefore possible for the behavior of the detecting pixels of the pair to be asymmetric. In particular when the image line is correctly aligned at the center (situation ③, FIG. 3) the difference $\Delta S$ between their output signals will possibly not be zero. However, it will be noted that this difference remains deterministic and can be integrated into the digital processing operations carried out by the computer of the OCT apparatus.

However, another arrangement of the masked and detecting portions in the pairs allows this to be avoided: specifically, it is possible to place, side-by-side, the masked portions of the detecting pixels of a given pair, as explained below with reference to FIG. 7. In this case, the useful-photosensitive-area portion of the detecting pixel is placed in the rectangle R on the side adjacent to the image-capturing pixel, and the latter no longer sees the mask of the detecting pixel.

Figure 6:
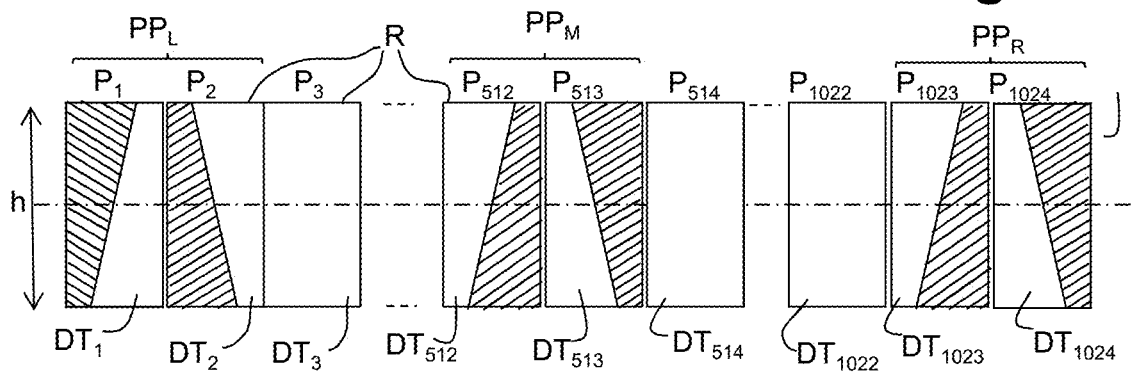
FIGS. 6 and 7 illustrate a photosensitive row of a linear sensor comprising, in addition to the two pairs of detecting pixels at each end of the row, an additional pair of detecting pixels placed in the vicinity of the middle of the row, in two example embodiments of the detecting pixels of the middle pair.
Figure 7:
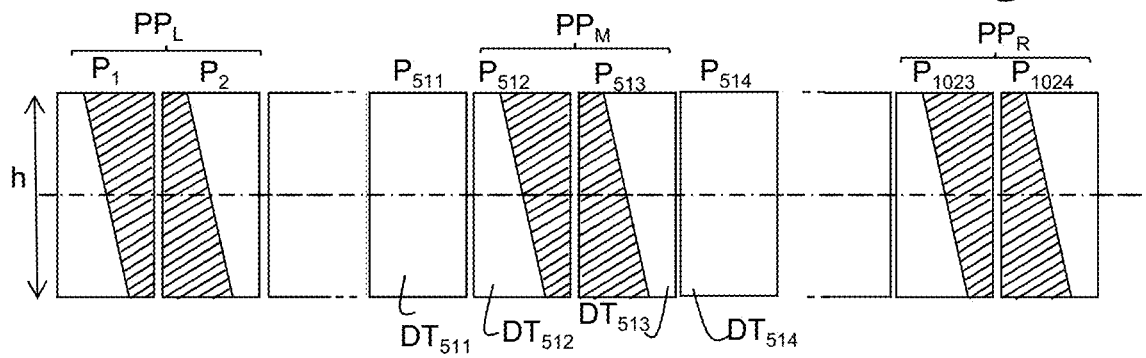

FIGS. 6 and 7 illustrate a variant of the invention provided for the case where the luminous line projected by the spectrometer of the OCT apparatus is not rectilinear, but for example of half-sinusoid shape with a maximum amplitude substantially in the middle.

The row of pixels then comprises at least one third pair of detecting pixels according to the invention, which is placed substantially in the middle of the row of pixels. In the example, illustrated in FIGS. 6 and 7, of a row of pixels including N=1024 pixels, this third pair is formed with pixels $P_{512}$ and $P_{513}$. In this example, the image line will then be aligned when it is on the same side with respect to the central axis AA at the two ends, and on the other side in the middle.

In FIG. 6, the three detecting pairs are obtained in the same way as in FIG. 5: the photosensitive area of each pixel is divided into two portions, one masked and the other not (the latter serving for the alignment detection) and the masked portion is located on the same side in the two detecting pixels of a given pair. This configuration is not the most optimal with respect to edge effects due to optical masking for the detecting pixels of the pair $PP_M$ in the middle of the row: in the example, the masked portion of pixel $P_{513}$ of the pair $PP_M$ is on the side adjacent to an image-capturing pixel ($P_{514}$).

FIG. 7 shows a variant of this configuration, in which the masked portions of the two detecting pixels of the central pair are placed side-by-side. The image-capturing pixels are no longer subject to edge effects. For example, considering in the figure the image-capturing pixels $P_{511}$ and $P_{514}$ that flank the pixels $P_{512}$ and $P_{513}$ of the pair $PP_M$: the detecting zones $DT_{511}$ and $DT_{514}$ are not impacted by the mask delineating the detecting zones $DT_{512}$ and $DT_{513}$ of the pair $PP_M$. Furthermore, in each of the detecting zones $DT_{512}$ and $DT_{513}$ there is an edge effect only on a single side. This arrangement is advantageously used in each of the detecting pairs of the row: an optimal configuration is obtained in respect of possible edge effects, both for the image-capturing pixels and for the detecting pixels.

In any case, as already indicated, the outputs of the detecting pixels may also be used, in operation, with the outputs of the image-capturing pixels to reconstruct OCT images, provided interpolation computations are provided to compensate for the differences between the useful detecting area of the alignment-detecting pixels and of the image-capturing pixels and to compensate for any edge effects due to optical masking.

In practice, the delineated photosensitive portion of the detecting pixels will possibly have an area that corresponds to about half, or preferably to a little more than half, of the rectangular photosensitive area of the image-capturing pixels. However, this ratio could equally well be different i.e. lower or higher. In the image-capturing pixels, the useful detecting height may be decreased to a value equal to two or three times the size of the luminous information (width e of the image line) to be captured.

It is possible to delineate the photosensitive area portions allowing light radiation to be detected in the alignment-detecting pixels without optical masking.

In the preceding embodiments, the N pixels of the row were produced, in a semiconductor substrate, identically, and in particular with the same rectangular photosensitive area; the detecting pixels among these N pixels were then demarcated by means of an optical mask.

It is here proposed to directly demarcate, in the semiconductor, the detecting pixels, i.e. the photosensitive area of the detecting pixel is given the desired shape (F or F') directly. This desired shape directly defines the useful photosensitive area, which is of a different shape to that of the rectangle R of the useful photosensitive areas of the image-capturing pixels, while preserving the pitch of the pixels. Thus, the useful photosensitive portion that allows light radiation to be detected and the one or more portions in which detection must not occur are produced directly, by differentiated implantation (opposite dopant types), in each alignment-detecting pixel, the sum of the areas of these portions being equal to the photosensitive area (rectangle R) of the image-capturing pixels. This embodiment is less effective in terms of response of the detecting pixels, but is an interesting alternative to optical masking.

More precisely, when a row of pixels is produced, the pixels are isolated from one another by implantation, and the isolating implantation region encircles the useful photosensitive portion (and also the active regions of the controlling elements) of each pixel.

What it is proposed to do is to modify the design of the implantation masks so that, in the location of the detecting pixels, the active photosensitive region is given, in the surface plane, the desired shape directly, with a width that varies over the height of the pixel; this shape may be any one of the shapes illustrated in FIGS. 4 to 6; and this shape is encircled by the isolating region, which prevents the detection of light radiation. In one example, the useful photosensitive portion of the pixels is an n-doped photodiode region; and the isolating region is a p-doped region that cannot accumulate photogenerated charge. The n-doped photodiode region may comprise, on its surface, a highly p-doped surface layer that is biased with the reference potential of the substrate.

If the detecting pixels $P_1$ and $P_2$ shown in FIG. 8 are taken by way of example, the dotted zones $DT_1$ and $DT_2$ that represent the zones in which detection of light radiation is possible in these pixels will then be n-doped regions. Furthermore, the "white" zones, $m_1$ and $m_2$, of these pixels will be highly p-doped regions. In the image-capturing pixels, all of the photosensitive zone (rectangle R) of these pixels will be an n-doped region. As has already been explained above, it will then be possible to define the useful detecting height $h_u$ of the image-capturing pixels (and optionally also the useful detecting height of the alignment-detecting pixels) by optical masking, independently of whether or not the alignment-detecting pixels are defined by implantation or by optical masking.

The invention has been described by taking as an example a linear sensor the pixels of the photosensitive row of which are regularly spaced. The center-to-center distance was equal to p, the pitch of the array. The invention is not limited to this configuration. Specifically, a row of pixels with a variable pitch between the pixels could be used, in order to correspond to a given spectral spread of the spectrometer, allowing given wavelengths to be detected (correspondence between pixel position and wavelength).

The invention claimed is:

1. A linear sensor including a row of N pixels that are formed in a semiconductor substrate, and a circuit for reading out the N pixels, which delivers an output signal for each of the N pixels of the row, wherein the N pixels comprise image-capturing pixels that have a useful pixel photosensitive area able to receive photons and convert them into electric charge, which is area in the shape of a rectangle that is higher than it is wide, where the width is in the direction of the row and the height is in the perpendicular direction, and at least two spaced-apart pairs of alignment-detecting pixels, wherein the detecting pixels of each pair are pixels that are adjacent in the row of pixels and that have a useful photosensitive area the width of which varies monotonically in the height direction, but in opposite directions for the two detecting pixels of a given pair.

2. The linear sensor as claimed in claim 1, wherein a first pair is formed by the first two pixels of the row, and a second pair is formed by the last two pixels of the row.

3. The sensor as claimed in claim 2, comprising a third pair of detecting pixels in the vicinity of the center of the row of pixels.

4. The sensor as claimed in claim 1, wherein all the N pixels have the same physical makeup and the same photosensitive area in the shape of a rectangle, and an optical mask defines the useful photosensitive area of the alignment-detecting pixels.

5. The sensor as claimed in claim 4, wherein the useful photosensitive area of the detecting pixels of a pair forms a pattern in the rectangle of the photosensitive area of the image-capturing pixels, which extends over the height of the rectangle of the photosensitive image-capturing areas and one side of which corresponds to a long side of the rectangle.

6. The sensor as claimed in claim 1, wherein all the N pixels have the same physical makeup and the same photosensitive area in the shape of a rectangle, and an optical mask defines the useful photosensitive area of the image-capturing pixels.

7. The sensor as claimed in claim 6, wherein the useful photosensitive area of the detecting pixels of a pair forms a pattern in the rectangle of the photosensitive area of the image-capturing pixels, which extends over the height of the rectangle of the photosensitive image-capturing areas and one side of which corresponds to a long side of the rectangle.

8. The sensor as claimed in claim 1, wherein the shape of the useful photosensitive area of the alignment-detecting pixels is delineated by implantation.

9. The sensor as claimed in claim 1, wherein the shape of the useful photosensitive area of the image-detecting pixels has an axial symmetry with respect to a line directed along the height of the pixels.

10. The sensor as claimed in claim 9, wherein the useful photosensitive area of a detecting pixel is placed in said rectangle on a side adjacent to an image-capturing pixel.

11. A camera for a Fourier-domain optical-coherence-tomography imaging apparatus, including a linear sensor according to claim 1, which delivers information on the alignment of a luminous strip, namely the spectral image formed by the spectrometer in the plane of the photosensitive area of the sensor, on the row of image-capturing pixels of the sensor.

* * * * *